United States Patent
Reuter et al.

(10) Patent No.: US 11,508,593 B2
(45) Date of Patent: Nov. 22, 2022

(54) SIDE STORAGE PODS, ELECTRONIC DEVICE PROCESSING SYSTEMS, AND METHODS FOR OPERATING THE SAME

(71) Applicant: Applied Materials, Inc., Santa Clara, CA (US)

(72) Inventors: Paul B. Reuter, Austin, TX (US); Dean C. Hruzek, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 16/657,787

(22) Filed: Oct. 18, 2019

(65) Prior Publication Data

US 2020/0135522 A1 Apr. 30, 2020

Related U.S. Application Data

(60) Provisional application No. 62/751,526, filed on Oct. 26, 2018.

(51) Int. Cl.
*H01L 21/673* (2006.01)
*H01L 21/677* (2006.01)
*H01L 21/67* (2006.01)

(52) U.S. Cl.
CPC .. *H01L 21/67389* (2013.01); *H01L 21/67017* (2013.01); *H01L 21/67167* (2013.01); *H01L 21/67196* (2013.01); *H01L 21/67383* (2013.01); *H01L 21/67393* (2013.01); *H01L 21/67769* (2013.01); *H01L 21/67772* (2013.01); *B01D 2253/102* (2013.01); *H01L 21/67766* (2013.01)

(58) Field of Classification Search
CPC ............ H01L 21/673; H01L 21/67389; H01L 21/67196; H01L 21/67393; H01L 21/67769; H01L 21/67772; H01L 21/67383; H01L 21/67017; H01L 21/67167; H01L 21/67766
See application file for complete search history.

(56) References Cited

U.S. PATENT DOCUMENTS 5,518,450 A * 5/1996 Paveliev ............... B08B 17/00
454/60
6,318,945 B1 * 11/2001 Hofmeister ....... H01L 21/67751
118/719

(Continued)

FOREIGN PATENT DOCUMENTS

JP 2017-011150 A 1/2017
JP 2020161544 * 10/2020 ........... H01L 21/205

(Continued)

OTHER PUBLICATIONS

International Search Report and Written Opinion of International Application No. PCT/US2019/057651 dated Feb. 12, 2020.

*Primary Examiner* — Nicolas A Arnett
(74) *Attorney, Agent, or Firm* — Lowenstein Sandler LLP

(57) ABSTRACT

Electronic device processing systems including an equipment front end module with at least one side storage pod are described. The side storage pod has a chamber including a top substrate holder and a bottom substrate holder. In some embodiments, an exhaust port is located at a midpoint between the top substrate holder and the bottom substrate holder. Methods and systems in accordance with these and other embodiments are also disclosed.

20 Claims, 8 Drawing Sheets

(56) References Cited

U.S. PATENT DOCUMENTS

| | | | | |
|---|---|---|---|---|
| 6,415,736 | B1* | 7/2002 | Hao | H01L 21/67017 |
| | | | | 156/345.43 |
| 10,388,547 | B2* | 8/2019 | Holeyannavar | H01L 21/67379 |
| 10,777,437 | B2* | 9/2020 | Fukasawa | H01L 21/67017 |
| 10,847,390 | B2* | 11/2020 | Holeyannavar | H01L 21/6719 |
| 2011/0180002 | A1* | 7/2011 | Tanaka | H01J 37/3244 |
| | | | | 118/726 |
| 2014/0261803 | A1* | 9/2014 | Wang | H01L 21/67017 |
| | | | | 137/599.01 |
| 2015/0170945 | A1* | 6/2015 | Segawa | H01L 21/67772 |
| | | | | 414/217 |
| 2015/0228518 | A1 | 8/2015 | Hyon | |
| 2016/0118282 | A1* | 4/2016 | Maraschin | H01L 21/67393 |
| | | | | 414/222.07 |
| 2016/0284580 | A1* | 9/2016 | Woo | H01L 21/67393 |
| 2016/0379855 | A1* | 12/2016 | Fukasawa | H01L 21/6732 |
| | | | | 414/217 |
| 2017/0011942 | A1* | 1/2017 | Woo | H01L 21/67724 |
| 2018/0114710 | A1* | 4/2018 | Jeong | H01L 21/673 |
| 2018/0124960 | A1* | 5/2018 | Vincent | H01L 21/67201 |
| 2018/0277410 | A1* | 9/2018 | Woo | H01L 21/67389 |
| 2018/0374725 | A1* | 12/2018 | Holeyannavar | H01L 21/67201 |
| 2018/0374733 | A1* | 12/2018 | Pannese | H01L 21/67769 |

FOREIGN PATENT DOCUMENTS

| | | |
|---|---|---|
| KR | 10-1215962 B1 | 12/2012 |
| KR | 10-2015-0087015 A | 7/2015 |
| KR | 10-1637498 B1 | 7/2016 |
| KR | 10-2018-0074276 A | 7/2018 |

\* cited by examiner

SIDE STORAGE PODS, ELECTRONIC DEVICE PROCESSING SYSTEMS, AND METHODS FOR OPERATING THE SAME

RELATED APPLICATIONS

This application claims the benefit under 35 U.S.C. § 119(e) of U.S. Provisional Patent Application No. 62/751,526, filed Oct. 26, 2018, which is incorporated herein, in its entirety, by this reference.

TECHNICAL FIELD

The present disclosure relates to electronic device manufacturing, and more specifically to electronic device processing systems, side storage pods, and methods for operating the same.

BACKGROUND

Electronic device manufacturing systems may include multiple process chambers configured to perform various processes on substrates. Exposure of the substrates to certain environmental conditions during processing may degrade the substrates. For example, exposure to humidity during processing of substrates may degrade or destroy components fabricated on the substrates.

Accordingly, improved systems, apparatus, and methods for controlling the environmental conditions of substrates during processing are desired.

SUMMARY

In a first aspect, a side storage pod is provided. The side storage pod includes a first chamber having a first chamber opening configured to be located adjacent a wall of an equipment front end module (EFEM); and a first storage container received in the first chamber. The first storage container includes a first storage container opening located adjacent the first chamber opening; a first storage container chamber fluidly coupled with the first storage container opening; a plurality of substrate holders located in the first storage container chamber, the plurality of substrate holders extending between a top substrate holder and a bottom substrate holder; a first exhaust plenum coupled to the first storage container chamber opposite the first storage container opening, wherein the plurality of substrate holders are located between the first storage container opening and the first exhaust plenum; and a first exhaust port having a center located on the first exhaust plenum within 25% of a midpoint between the top substrate holder and the bottom substrate holder.

In another aspect, an electronic device processing system is provided. The electronic device processing system includes an equipment front end module (EFEM) having a wall including an EFEM opening; a side storage pod including a first chamber having a first chamber opening configured to be located adjacent the EFEM opening; and a first storage container received in the first chamber. The first storage container includes a first storage container opening located adjacent the first chamber opening; a first storage container chamber fluidly coupled with the first storage container opening; a plurality of substrate holders located in the first storage container chamber, the plurality of substrate holders extending between a top substrate holder and a bottom substrate holder; an exhaust plenum coupled to the first storage container chamber opposite the first storage container opening, wherein the plurality of substrate holders are located between the first storage container opening and the exhaust plenum; and an exhaust port having a center located on the exhaust plenum within 25% of a midpoint between the top substrate holder and the bottom substrate holder.

In another aspect, a method of operating an electronic device processing system is provided. The method includes, providing an equipment front end module (EFEM) having a wall including an EFEM opening; providing a side storage pod including a pod chamber and a chamber opening; locating the chamber opening adjacent the EFEM opening; locating a storage container having a storage container opening and a storage container chamber in the pod chamber; placing the storage container opening adjacent the EFEM opening; placing one or more substrates in the storage container chamber on one or more substrate holders having a top substrate holder and a bottom substrate holder; and flowing a gas from the EFEM opening, through the storage container opening, into the storage container chamber, past the one or more substrates, and out an exhaust plenum having a center located within 25% of a midpoint between the top substrate holder and the bottom substrate holder.

Other features and aspects of the present disclosure will become more fully apparent from the following detailed description, the appended claims, and the accompanying drawings.

BRIEF DESCRIPTION OF THE DRAWINGS

The drawings, described below, are for illustrative purposes and are not necessarily drawn to scale. The drawings are not intended to limit the scope of the disclosure in any way.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts throughout the several views. Features of the various embodiments described herein may be combined with each other, unless specifically noted otherwise.

Electronic device manufacturing may involve exposing substrates to different chemicals during a plurality of processes. After processes are applied to the substrates, the substrates may undergo outgassing. Some processes applied to the substrates may cause the substrates to outgas corrosive chemicals, such as fluorine, bromine, and chlorine. If these gases are not removed from the substrates, the gases may cause defects in the substrates. In addition, if the substrates are exposed to certain gases, such as water vapor or oxygen, the substrates may be damaged.

According to one or more embodiments of the disclosure, electronic device processing systems and methods adapted to improve substrate processing are provided. The systems and methods described herein may provide efficiency and/or processing improvements in the processing of substrates by controlling environmental exposure of the substrates, such as conditions within one or more side storage pods coupled to an equipment front end module (hereinafter "EFEM"). One or more side storage containers (sometimes referred to as "storage containers") may be configured to be receivable within a side storage pod and may include substrate holders (e.g., shelves) that receive substrates, such as during idle periods before and/or after processes are applied to the substrates. An inert gas, such as a gas that does not react with the substrates, may pass over a plurality of substrates received on the substrate holders. The flow of the inert gas past the substrates may be even so that all the substrates are exposed to the inert gas.

Gas may flow from the EFEM into a side storage container where the gas flows past the substrates located on the substrate holder. In some embodiments, the gas may be exhausted from the rear of the side storage container at an exhaust port located approximately midway between a top substrate holder and a bottom substrate holder. Such an exhaust configuration improves even gas flow past all the substrates stored on the substrate holders.

Further details of example embodiments of side storage pods, electronic device processing systems including a side storage pod, and methods of operating the same are described with reference to FIGS. 1-7 herein.

Figure 1:
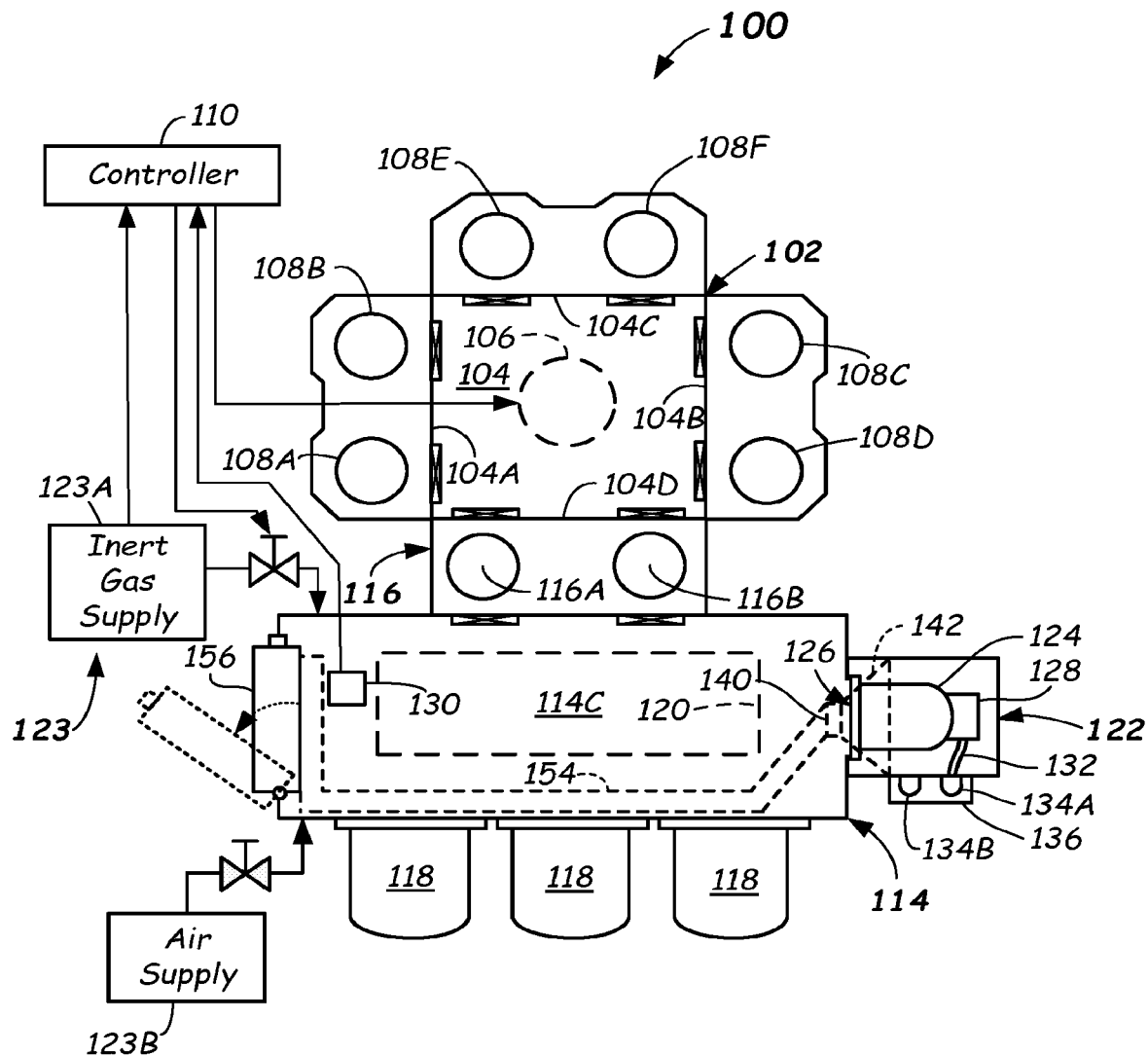
FIG. 1 illustrates a schematic top view of an electronic device processing system including a side storage pod according to one or more embodiments of the disclosure.

FIG. 1 illustrates a schematic diagram of an example embodiment of an electronic device processing system 100 according to one or more embodiments of the present disclosure. The electronic device processing system 100 may include a mainframe housing 102 having housing walls defining a transfer chamber 104. A transfer robot 106 (shown as a dotted circle) may be at least partially housed within the transfer chamber 104. The transfer robot 106 may be configured to place and extract substrates to and from destinations via operation of arms (not shown) of the transfer robot 106. Substrates as used herein may mean articles used to make electronic devices or circuit components, such as semiconductor wafers, silicon-containing wafers, patterned wafers, glass plates, or the like.

The motion of the various arm components of the transfer robot 106 may be controlled by suitable commands to a drive assembly (not shown) containing a plurality of drive motors of the transfer robot 106 as commanded from a controller 110. Signals from the controller 110 may cause motion of the various components of the transfer robot 106.

In the embodiments shown in FIG. 1, the transfer chamber 104 in the depicted embodiment may be square or slightly rectangular in shape and may include a first facet 104A, second facet 104B opposite the first facet 104A, a third facet 104C, and a fourth facet 104D opposite the third facet 104C. The first facet 104A, second facet 104B, third facet 104C, and fourth facet 104D may be planar and entryways into chamber sets that may lie along the respective facets, for example. However, other suitable shapes of the mainframe housing 102, transfer chamber 104, and/or facets 104A-104D, and/or other numbers of facets and/or process chambers are possible.

The destinations for the transfer robot 106 may be the process chambers 108A-108F coupled to the facets 104A-104C and which may be configured and operable to carry out processes on the substrates delivered thereto. The processes may be any suitable processes such as plasma vapor deposition (PVD) or chemical vapor deposition (CVD), etch, annealing, pre-clean, metal or metal oxide removal, or the like. Other processes may be carried out on substrates therein.

Substrates may be received into the transfer chamber 104 from an equipment front end module (hereinafter "EFEM") 114, and also may exit the transfer chamber 104, to the EFEM 114, through a load lock apparatus 116 that is coupled to a surface (e.g., a rear wall) of the EFEM 114. The load lock apparatus 116 may include one or more load lock chambers (e.g., load lock chambers 116A, 116B, for example).

In some embodiments, the EFEM 114 may be an enclosure having sidewall surfaces (such as front, rear, and side walls, a top, and a bottom, for example) forming an EFEM chamber 114C. One or more load ports may be provided on surfaces (e.g., front surfaces) of the EFEM 114 and may be configured to receive one or more substrate carriers 118 (e.g., FOUPs) thereat. Three substrate carriers 118 are shown, but more or less numbers of substrate carriers 118 may be docked with the EFEM 114.

The EFEM 114 may include a suitable load/unload robot 120 (shown dotted) of conventional construction within the EFEM chamber 114C thereof. The load/unload robot 120 may be configured and operational, once a door of a substrate carrier 118 is opened, to extract substrates from the substrate carrier 118 and feed the substrates through the EFEM chamber 114C and into the one or more load lock chambers 116A, 116B of the load lock apparatus 116.

The load/unload robot 120 also may be configured and operational, once the door of a substrate carrier 118 is opened, to extract substrates from the substrate carrier 118 and feed the substrates into a side storage pod 122 while the substrates sit idle awaiting processing. The load/unload robot 120 may further be configured to extract substrates from and load substrates into the side storage pod 122 prior to and/or after processing in one or more of the process chambers 108A-108F. In some embodiments, the side storage pod 122 may be coupled to a side wall of the EFEM 114. In some embodiments, the load/unload robot 120 may be a high-Z robot configured to access substrates stacked greater than 26 high, or even fifty-two high or higher, in the side storage pod 122.

In the depicted embodiment, the EFEM chamber 114C may be provided with environmental controls providing an environmentally-controlled atmosphere therein. In particular, an environmental control system 123 may be coupled to the EFEM 114 and may be operational to monitor and/or control environmental conditions within the EFEM chamber 114C. In some embodiments, and at certain times, the EFEM chamber 114C may receive an inert and/or non-reactive gas therein, such as argon (Ar), nitrogen ($N_2$), or helium (He), from an inert gas supply 123A. In other embodiments, or at other times, air (e.g., dry filtered air) may be provided from an air supply 123B. In some embodiments, the environmental conditions within the EFEM chamber 114C may be present in the interiors of storage containers, such as side storage containers 124 and 224 (FIG. 2) located within the side storage pod 122.

In more detail, the environmental control system 123 may control at least one of: 1) relative humidity (RH), 2) temperature (T), 3) an amount of $O_2$, and/or 4) an amount of inert gas, within the EFEM chamber 114C. Other environmental conditions of the EFEM 114 may be monitored and/or controlled, such as gas flow rate into the EFEM chamber 114C, or pressure in the EFEM chamber 114C, or both. As described herein, the inert and/or non-reactive gas from the inert gas supply 123A may be argon, $N_2$, helium, another non-reactive gas, or mixtures thereof. In some embodiments, compressed bulk inert gases having low $H_2O$ levels (e.g., purity≥99.9995%, $H_2O$≤5 ppm) may be used as the inert gas supply 123A in the environmental control system 123, for example. Other $H_2O$ levels may be used.

In some embodiments, one or more environmental monitors 130 may measure a plurality of environmental conditions. For example, in some embodiments, the environmental monitors 130 may measure the relative humidity value as discussed above. The environmental monitors may also measure a level of oxygen ($O_2$) within the EFEM 114. In some embodiments, a control signal from the controller 110 to the environmental control system 123 initiating a flow of a suitable amount of an inert gas from the inert gas supply 123A into the EFEM chamber 114C may take place to control the level of oxygen ($O_2$) to below a threshold $O_2$ value. The environmental monitors 130 may also measure the absolute or relative pressure within the EFEM 114. In some embodiments, the controller 110 may control the amount of flow of an inert gas from the inert gas supply 123A into the EFEM chamber 114C to control the pressure in the EFEM chamber 114C.

The side storage pod 122 attached to the EFEM 114 may store substrates under specific environmental conditions. For example, the side storage pod 122 may store the substrates in the same environmental conditions as are present in the EFEM chamber 114C. In some embodiments, the side storage pod 122 may be fluidly coupled to the EFEM chamber 114C and may receive gas (e.g., inert gas) from the EFEM 114. Accordingly, substrates stored in the side storage pod 122 are exposed to the same environmental conditions as the EFEM 114. The side storage pod 122 may include exhaust conduits that exhaust gas from the side storage pod 122, which further enables the substrates stored in the side storage pod 122 to be constantly exposed to the same environmental conditions of the EFEM 114.

The first side storage container 124 (sometimes referred to herein as the "first storage container") may be received in the side storage pod 122. In some embodiments, the side storage pod 122 may receive one or more vertically-aligned and/or stacked side storage containers. The first side storage container 124 may include an opening 126 that faces the EFEM 114. The opening 126 may be fluidly coupled to a chamber (e.g., an interior) of the first side storage container 124. In some embodiments, the opening 126 may seal to the EFEM 114, which may keep gas from the EFEM 114 solely in the first side storage container 124. The first side storage container 124 may include an exhaust plenum 128 or plenum located opposite the opening 126. The exhaust plenum 128 may be coupled to a first exhaust conduit 132 that may couple between the exhaust plenum 128 and an exterior of the side storage pod 122. Thus, exhaust gas within the interior of the first side storage container 124 may be prevented from entering the interior of the side storage pod 122.

In some embodiments, the first exhaust conduit 132 may be coupled to a first external exhaust conduit 134A. A second exhaust conduit (432 in FIG. 4A) may be coupled between a second side storage container (224 in FIG. 2) and a second external exhaust conduit 134B. Both the first external exhaust conduit 134A and the second external exhaust conduit 134B may be located within a cover 136. In some embodiments, the cover 136, rather than the first external exhaust conduit 134A and the second external exhaust conduit 134B may exhaust the exhaust gas from the side storage containers 124, 224. In other embodiments, the first external exhaust conduit 134A and the second external exhaust conduit 134B may pass through the interior of the side storage pod 122.

Figure 2:
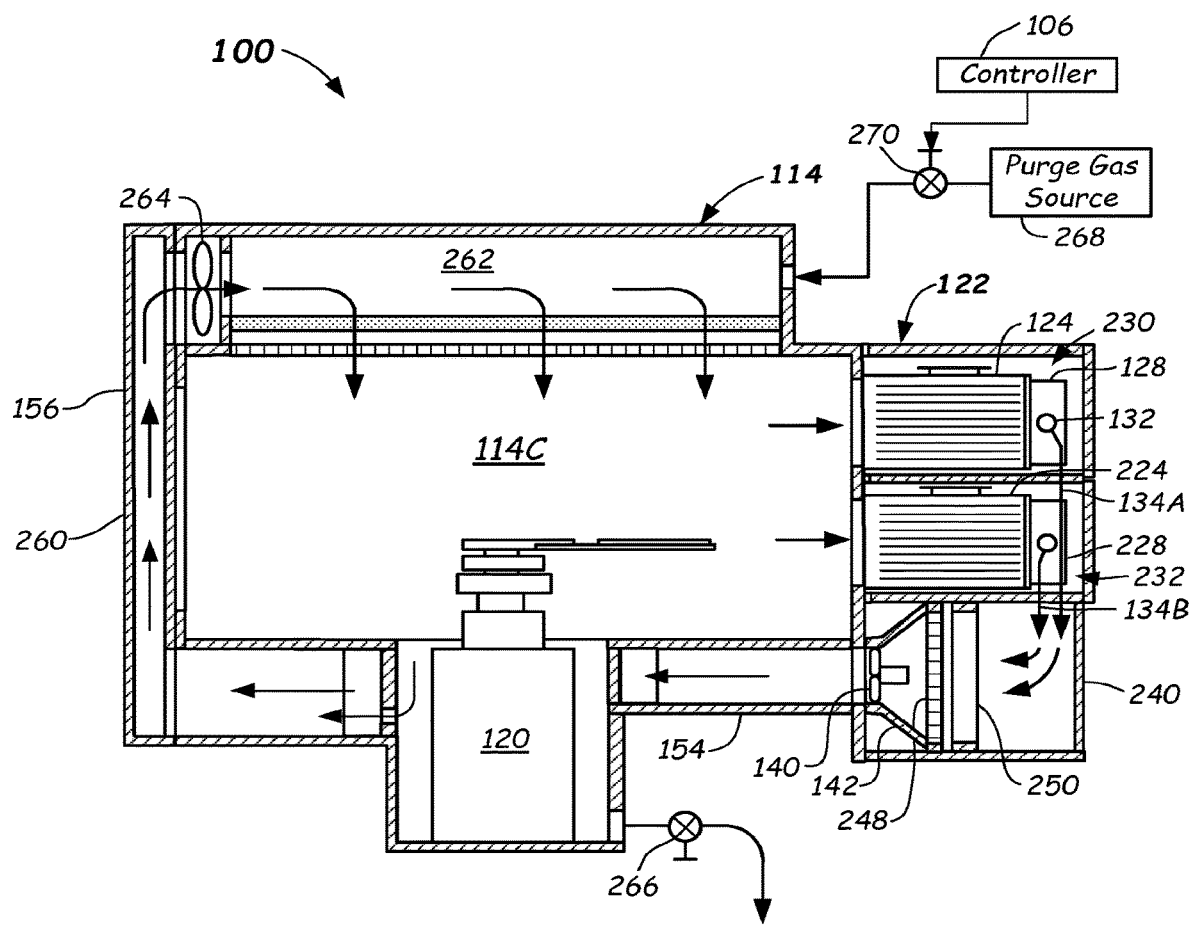
FIG. 2 illustrates a cross-sectioned side view of an equipment front end module (hereinafter "EFEM") including a side storage pod coupled to a wall of the EFEM body according to one or more embodiments of the disclosure.

Additional reference is made to FIG. 2, which illustrates a side, cross-sectioned, elevation view of the EFEM 114 including the side storage pod 122 coupled to the EFEM 114. The side storage pod 122 may include a first chamber 230 that receives the first side storage container 124 and a second chamber 232 that receives a second side storage container 224 (sometimes referred to herein as the "second storage container"). In some embodiments, the first side storage container 124 and the second side storage container 224 may seal to the exterior of the EFEM 114, which may isolate gas in the EFEM 114 from gas in the first chamber 230 and the second chamber 232.

Both the first external exhaust conduit 134A and the second external exhaust conduit 134B may be coupled to a plenum 240 that receives the exhaust gas from the first side storage container 124 and the second side storage container 224. The plenum 240 may be attached to or be a portion of the side storage pod 122, for example. In some embodiments, the side storage pod 122 may be removably attached to the EFEM 114. In one or more embodiments, gas may be drawn from the plenum 240 by a fan 140 located in a plenum exhaust port. A plenum 142 located between the fan 140 and the plenum 240 may direct the gas to the fan 140, for example. In some embodiments, the combined gas flow through the first side storage container 124 and the second side storage container 224 is about 150-175 cfm (4.25-5.0 cmm), although other gas flows may be used.

A filter 248 may be in the gas flow path generated by the fan 140. For example, the filter 248 may be located in the plenum 142 so that all the gas drawn by the fan 140 passes through the filter 248. Other filter locations may be used. In some embodiments, the filter 248 may be a chemical filter that filters one or more gases that are outgassed by substrates in the side storage pod 122 after application of a fabrication process. In some embodiments, the filter 248 filters chlorine, bromine, and/or fluorine. In some embodiments, the filter 248 may filter base gases, such as ammonia ($NH_3$) (e.g., to less than or equal to about 5.0 ppb or another target filter level). In some embodiments, the filter 248 may filter acidic gases, such as fluorine (F), chlorine (Cl), bromine (Br), acetate (OAc), nitrogen dioxide ($NO_2$), nitrate ($NO_3$), phosphate ($PO_4$), hydrogen fluoride (HF), and hydrochloric acid (HCl) (e.g., to equal to or less than about 1.0 ppb or another target filter level). In some embodiments, the filter 248 may be an activated carbon filter. In other embodiments, the filter 248 may be a particulate filter or include a particulate filter. In some embodiments, the exhaust gas from the first side storage container 124 and the second side storage container 224 are not filtered or recirculated into the EFEM 114.

In some embodiments, a heater 250 may be located in the gas flow generated by the fan 140. The heater 250 may heat the exhaust gas to a predetermined temperature before the exhaust gas is recirculated into the EFEM 114. In some embodiments, the heat generated by the heater 250 may be used as a reactant and/or to change the relative humidity in the EFEM 114 and/or the side storage pod 122. In some embodiments, the heater 250 may heat the gas in the EFEM 114 to increase outgassing from substrates located in the side storage pod 122.

The fan 140 may force gas (e.g., filtered gas) through ducts to the top of the EFEM 114 where it is recirculated back into the EFEM 114. For example, a duct 154 may extend between the plenum 142 and an access door 156 on the EFEM 114. In some embodiments, the duct 154 may bend to fit through tight confines within the EFEM 114. A duct 260 may couple to the duct 154 and may extend through the access door 156. By extending the duct 260 through the access door 156, the space occupied by the duct 260 is reduced and/or kept minimal. A fan 264 may assist forcing the gas from the duct 260 into a plenum 262. In some embodiments, the plenum 262 may include or be coupled to outlets that cause a laminar gas flow through the EFEM 114 and back into the side storage pod 122. Additional chemical and/or particulate filters may be located in the plenum 262.

In some embodiments, a portion of the gas within the duct 154 and/or the plenum 240 may be exhausted from the EFEM 114. For example, an exhaust valve 266 may be provided at a suitable location to exhaust a portion of gas from the EFEM 114, such as after the gas is filtered by the filter 248. In some embodiments, about 5-20% of the gas present in the duct 154 may be exhausted from the EFEM 114. Other amounts of gas may be exhausted. In these or other embodiments, a source of supplement gas, such as a purge gas source 268, may be employed to provide additional gas to the EFEM 114. For example, the same amount of gas exhausted by the exhaust valve 266 may be introduced to the plenum 262 and/or the side storage pod 122 using a gas flow valve 270. Other amounts of gas may be introduced. In some embodiments, the exhaust valve 266 and/or the gas flow valve 270 may be controlled by the controller 110 or another controller. The purge gas source 268 may include, for example, an inert and/or non-reactive gas such as Ar, N2, He, or the like, dry filtered air, etc.

Figure 3:
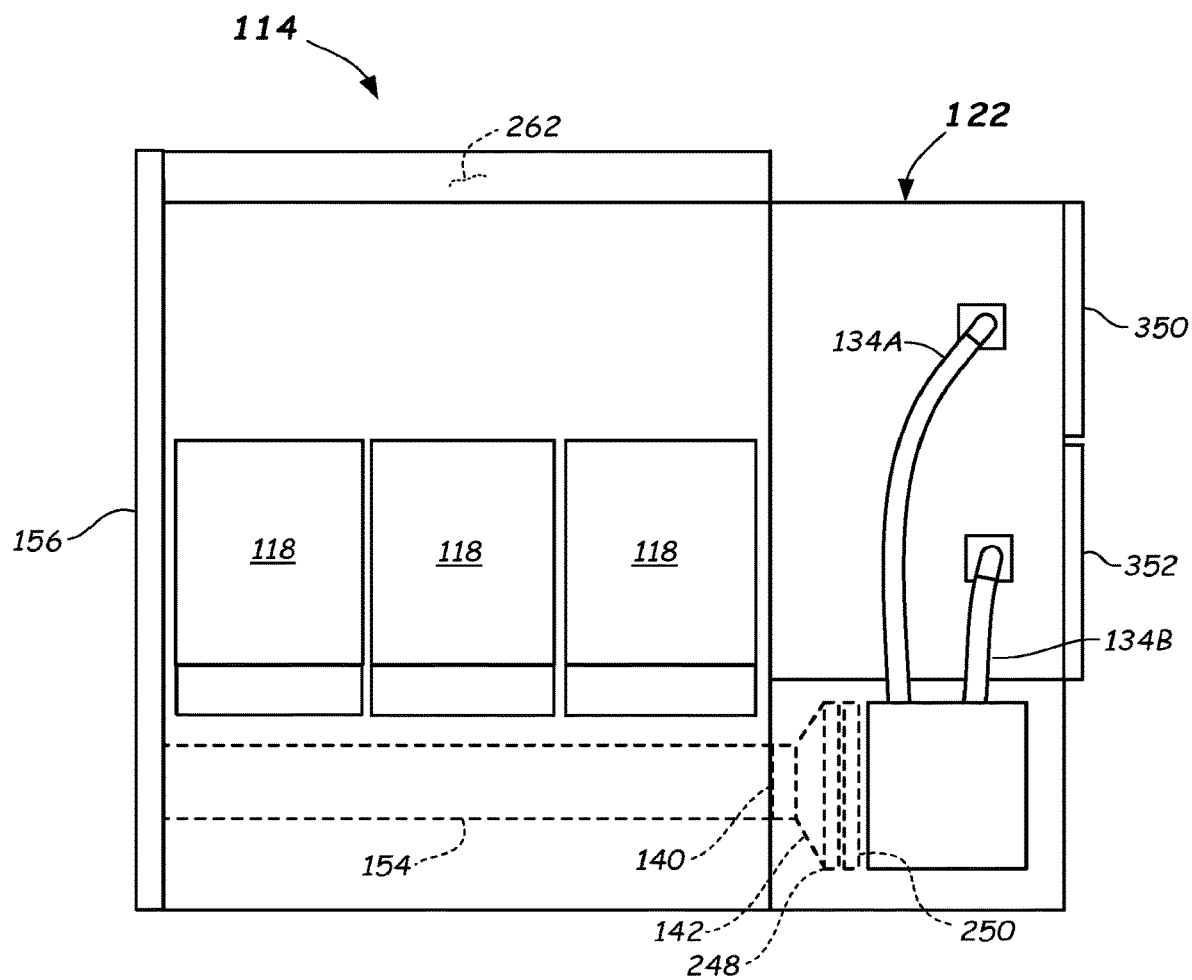
FIG. 3 illustrates a side view of a side storage pod coupled to a wall of the EFEM body according to one or more embodiments of the disclosure.

FIG. 3 illustrates a front elevation view of the EFEM 114 and a side elevation view of an embodiment the side storage pod 122. The side storage pod 122 depicted in FIG. 3 may include a first door 350 and a second door 352. The first door 350 and the second door 352 may form a seal over respective door openings located at end portions of the side storage pod 122. The first door 350 and the second door 352 may have closed states and open states wherein the side storage containers 124, 224 (FIG. 2) may pass through the door openings. For example, the first door 350 and the second door 352 may be hinge-type doors including hinges (not shown) or removable panel doors (e.g., screwed-on sealed panel doors) that enable access to the first chamber 230 (FIG. 2) and the second chamber 232 (FIG. 2) of the side storage pod 122, yet sealing thereof when closed. In some embodiments, a single door may be used in place of the first door 350 and the second door 352. A suitable O-ring, gasket, or other seal on the first door 350 and the second door 352 or on the end portions may form hermetic seals of the side storage pod 122. In some embodiments, the first door 350 may seal the first chamber 230 that is separated from and separately sealable from the second chamber 232 sealed by the second door 352. Other types of doors may be used to access the interior of the side storage pod 122.

Figure 4A:
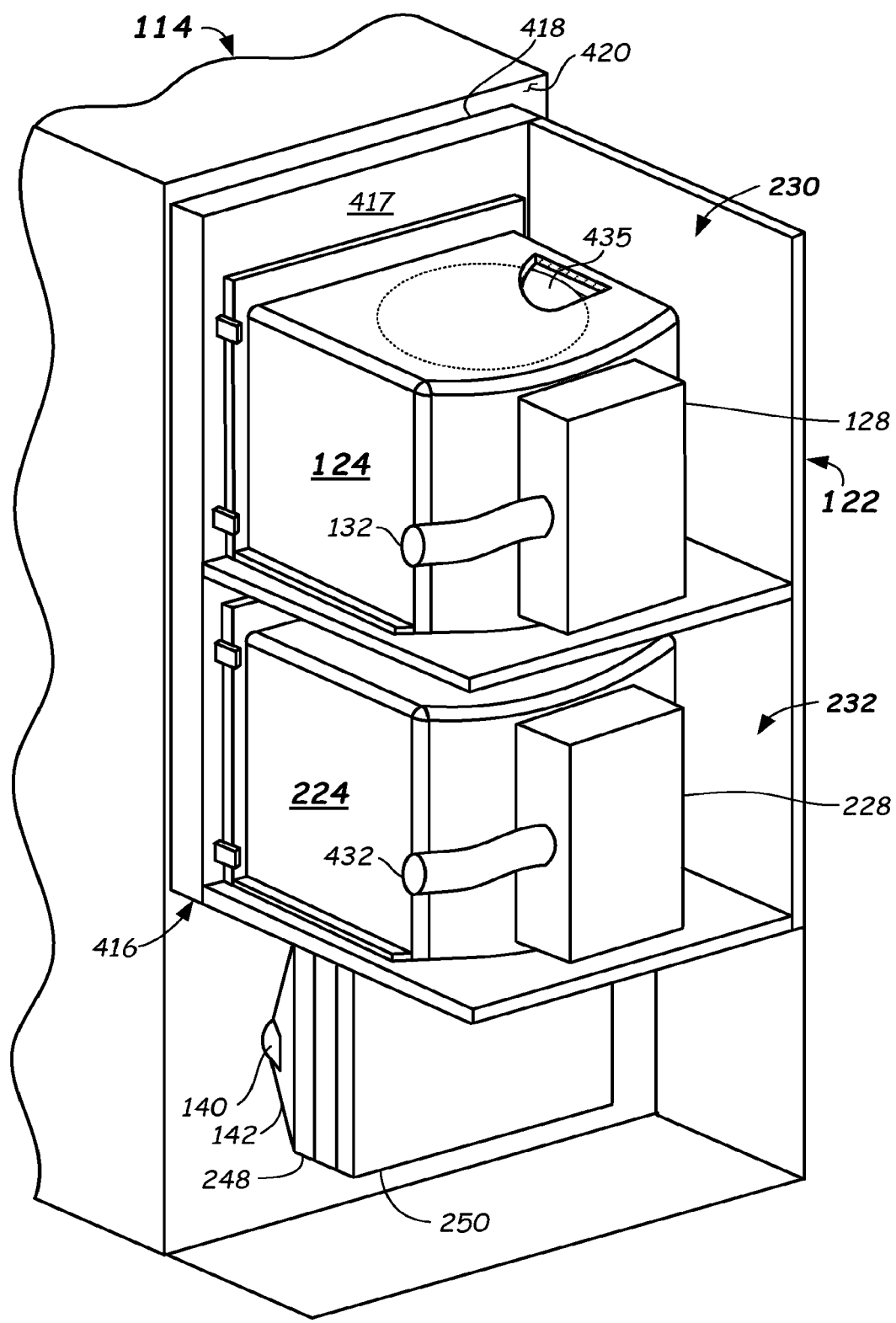
FIG. 4A illustrates a partial isometric view of a side storage pod coupled to an EFEM with a side wall, a top wall, and doors of the side storage pod removed according to one or more embodiments of the disclosure.

Additional reference is now made to FIG. 4A, which illustrates a partial cut-away view of the side storage pod 122. The side storage pod 122 may include a panel 416 having a first side 417 and a second side 418. Specifically, the first side 417 of the panel 416 may at least partially define the first chamber 230 and the second chamber 232 of the side storage pod 122. The second side 418 of the panel 416 may be attached to a wall 420 at least partially forming the exterior of the EFEM 114. The panel 416 may form a hermetically-sealed interface between the interior of the EFEM 114 and the first chamber 230 and the second chamber 232 of the side storage pod 122 as described herein. In some embodiments, the panel 416 may be integrally formed with the side storage pod 122 or the EFEM 114.

The first chamber 230 may include the first exhaust conduit 132 coupled to the first side storage container 124 and the second chamber 232 may include a second exhaust conduit 432 coupled to a second plenum 228 on the second side storage container 224. The first exhaust conduit 132 may couple to the first external exhaust conduit 134A (FIG. 3). The second exhaust conduit 432 may couple to the second external exhaust conduit 134B (FIG. 3). In some embodiments, both the first exhaust conduit 132 and the second exhaust conduit 432 may be flexible so as to enable replacement of the first side storage container 124 and the second side storage container 224.

Figure 4B:
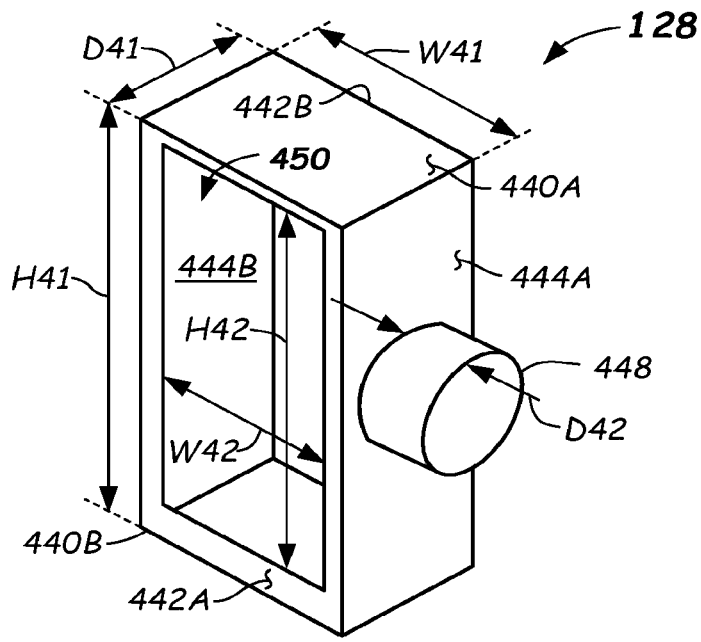
FIG. 4B illustrates an isometric view of an exhaust plenum of a side storage container according to one or more embodiments of the disclosure.
Figure 4C:
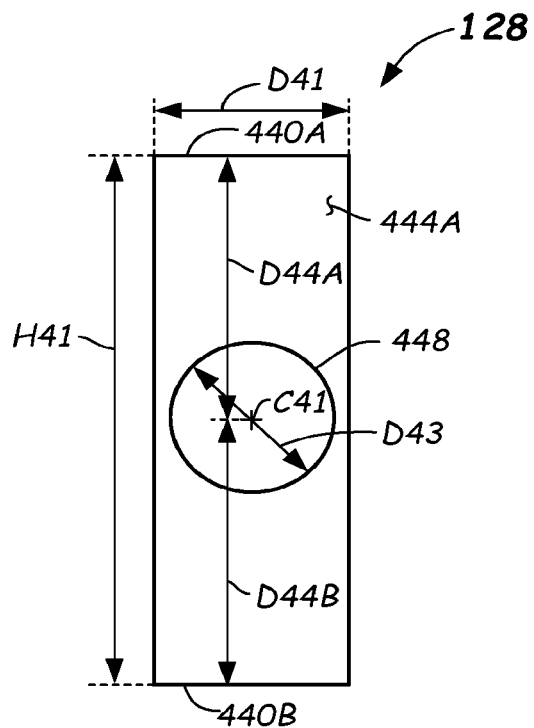
FIG. 4C illustrates a side view of an exhaust plenum of a side storage container according to one or more embodiments of the disclosure.

Additional reference is made to FIG. 4B, which illustrates an isometric view of the exhaust plenum 128, and FIG. 4C, which illustrates a side view of the exhaust plenum 128. The exhaust plenum 128 may have a height H41 extending between a top side 440A and a bottom side 440B. In some embodiments, the height H41 may be between 25.0 cm and 30 cm. In other embodiments, the height H41 may be between 26.0 cm and 29.0 cm. The exhaust plenum 128 may have a depth D41 extending between a front side 442A and a rear side 442B. In some embodiments, the depth D41 may be between 7.0 cm and 10.0 cm. In other embodiments, the depth D41 may be between 8.0 and 9.0 cm. The exhaust plenum 128 may have a width W41 extending between a first vertical side 444A and a second vertical side 444B. In some embodiments, the width W41 may be between 12.0 cm and 17.0 cm. In other embodiments, the width W41 may be between 13.0 cm and 16.0 cm. Other dimensions may be used.

An exhaust port 448 may extend a distance D42 from the first vertical side 444A. In some embodiments, the distance D42 may be between 3.0 and 5.0 cm. The exhaust port 448 may be configured to couple to the first exhaust conduit 132. The exhaust port 448 may be round and may have a center C41 and an inside diameter D43. In some embodiments, the diameter D43 may be between 5.0 and 9.0 cm. In other embodiments, the diameter D43 may be between 6.0 and 8.0 cm. The exhaust port 448 may have shapes other than round, but may have a center location relative to the top side 440A and the bottom side 440B. A distance D44A may extend between the top side 440A and the center C41 and a distance D44B may extend between the center C41 and the bottom side 440B. In some embodiments, the distances D44A and D44B may be between 120 and 145 cm. In other embodiments, the distances D44A and D44B may be between 130 and 136 cm. In some embodiments, the distances D44A and D44B may be within 25% of each other. In other embodiments, the distances D44A and D44B may be within 15% or even within 5% of each other. The central location of the exhaust port 448 enables an even flow of gas across substrates located in the first side storage container 124 and/or the second side storage container 224. Accordingly, the center C41 may be within 25% of the midpoint between the top side 440A and the bottom side 440B. In other embodiments, the center C41 may be within 15% or even 5% of the midpoint between the top side 440A and the bottom side 440B.

The front side 442A may include an opening 450 that receives exhaust gas from the interior of the first side storage container 124. The opening may have a height H42 and a width W42. The height H42 and/or the width W42 may be configured to receive exhaust gas flowing over all the substrates stored in the first side storage container 124. In some embodiments, the center C41 is positioned midway or at a center point relative to the height H41.

Referring again to FIG. 4A, a plurality of substrates 435 are transferable between the first side storage container 124 and the EFEM 114 and the second side storage container 224 and the EFEM 114. For example, the load/unload robot 120 may transfer substrates 435 between the EFEM 114 and the first side storage container 124 and/or the second side storage container 224 before and/or after processing in the one or more process chambers 108A-108F (FIG. 1). The first side storage container 124 and the second side storage container 224 may maintain the substrates under specific (e.g., controlled) environmental conditions during their storage. For example, the substrates 435 may be exposed to an inert gas or other gas that is within the EFEM 114 as described above. The environmental conditions may be controlled to provide exposure to less than preselected thresholds of water and/or $O_2$, or other conditions as specified above.

Figure 5:
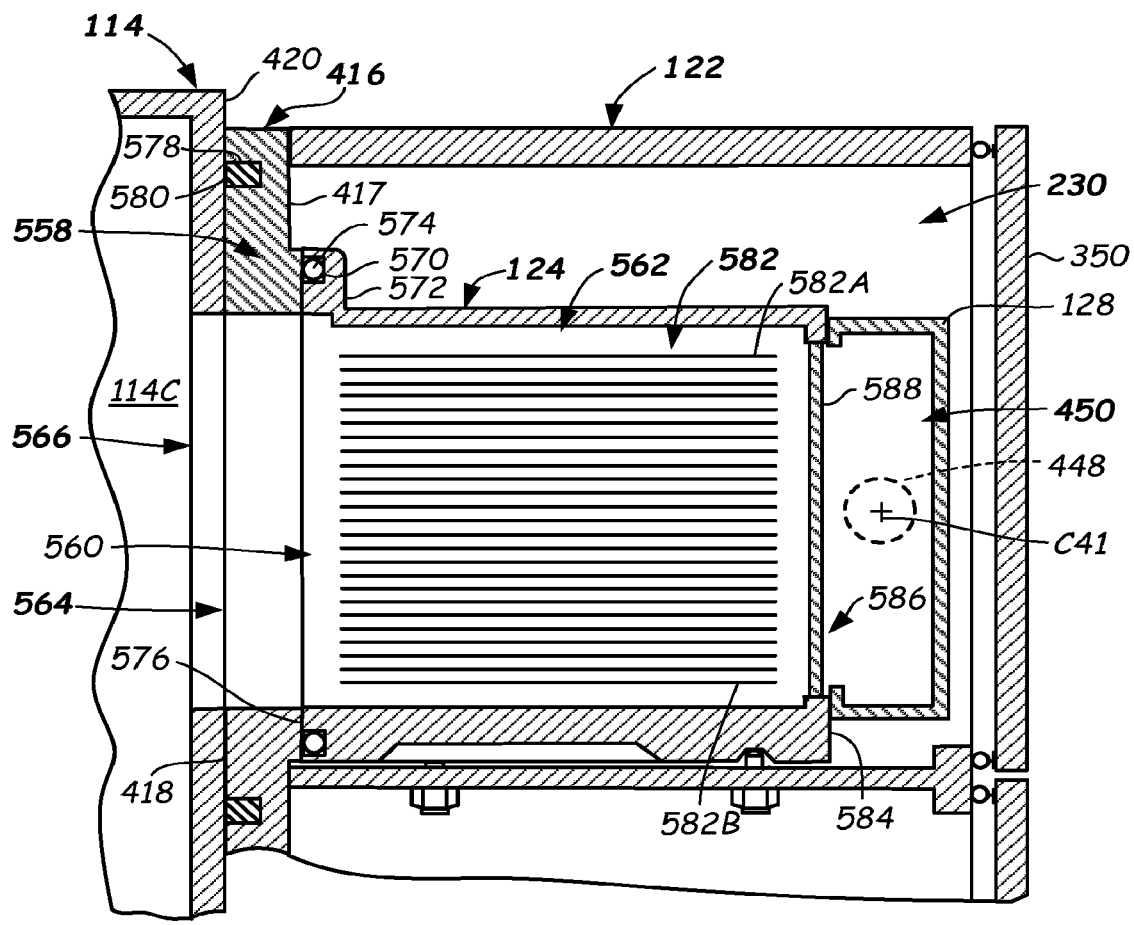
FIG. 5 illustrates a cross-sectioned side view of an interface between an EFEM body and a side storage pod having a side storage container located therein according to one or more embodiments of the disclosure.

Additional reference is now made to FIG. 5, which illustrates a side, cross-sectioned view of the first side storage container 124. The second side storage container 224 (FIG. 2) may be substantially similar or identical to the first side storage container 124. Both the first side storage container 124 and the second side storage container 224 may be configured to seal against an interface portion 558 of the panel 416. The first side storage container 124 may have a side storage container opening 560 that is fluidly coupled to a first side storage container chamber 562 (e.g., interior). The side storage container opening 560 may be located adjacent a chamber opening 564 in panel 416, which may be located adjacent an EFEM opening 566 of EFEM 114 to form a single fluidly-coupled opening into the first side storage container chamber 562. Thus, the EFEM chamber 114C may be fluidly coupled to the first side storage container chamber 562. The chamber opening 564 may be the same approximate size as the side storage container opening 560, for example.

A pod recess 570 may be formed in an upper flange 572 of the first side storage container 124 and may extend around the periphery of the side storage container opening 560. A pod seal 574 may be received within the pod recess 570. The pod seal 574 prevents gas from leaking past the interface of a front portion 576 of the first side storage container 124 and the interface portion 558 of the panel 416. In some embodiments, the pod seal 574 may be a pliable material, such as an elastomer-based material, that contacts the pod recess 570 and the interface portion 558.

The second side 418 of the panel 416 may have a panel recess 578 formed therein that extends around the periphery of the chamber opening 564. A panel seal 580 may be received within the panel recess 578 to prevent the exchange of gas between the panel 416 and the wall 420 of the EFEM 114. In some embodiments, the panel seal 580 may be a flat seal and may be made of ethylene propylene diene monomer (EPDM) rubber or another suitable material.

The first side storage container chamber 562 may include a plurality of substrate holders 582 configured to support substrates 435 (FIG. 4A) thereon. The substrate holders 582 may be vertically-stacked shelves formed onto the lateral sides of the first side storage container 124 and may include a top substrate holder 582A and a bottom substrate holder 582B. The substrate holders 582 may be spaced a distance from each other that enables gas flow around (e.g., above and below) substrates 435 (FIG. 4) received by and supported on the substrate holders 582. For example, the distance between the top substrate holder 582A and the bottom substrate holder 582B may be slightly less than the height H42 (FIG. 4B) to enable gas flow over all the substrates supported on the substrate holders 582 and into the exhaust plenum 128.

A rear portion 584 of the first side storage container 124 may include an opening 586 that fluidly couples the first side storage container chamber 562 with the opening 450 of the exhaust plenum 128. The exhaust plenum 128 may be configured to provide the above-described gas flow around the substrates 435 (FIG. 4A) received on the substrate holders 582. In some embodiments, the exhaust plenum 128 may have a height H41 (FIG. 4C) that extends vertically at least between the top substrate holder 582A and the bottom substrate holder 582B.

The center C41 of the exhaust port 448 may be located within 25% of a midpoint between the top substrate holder 582A and the bottom substrate holder 582B, for example. In other embodiments, the center C41 may be located within 15% of the midpoint between the top substrate holder 582A and the bottom substrate holder 582B. In other embodiments, the center C41 may be located within 5% of the midpoint between the top substrate holder 582A and the bottom substrate holder 582B.

Figure 6:
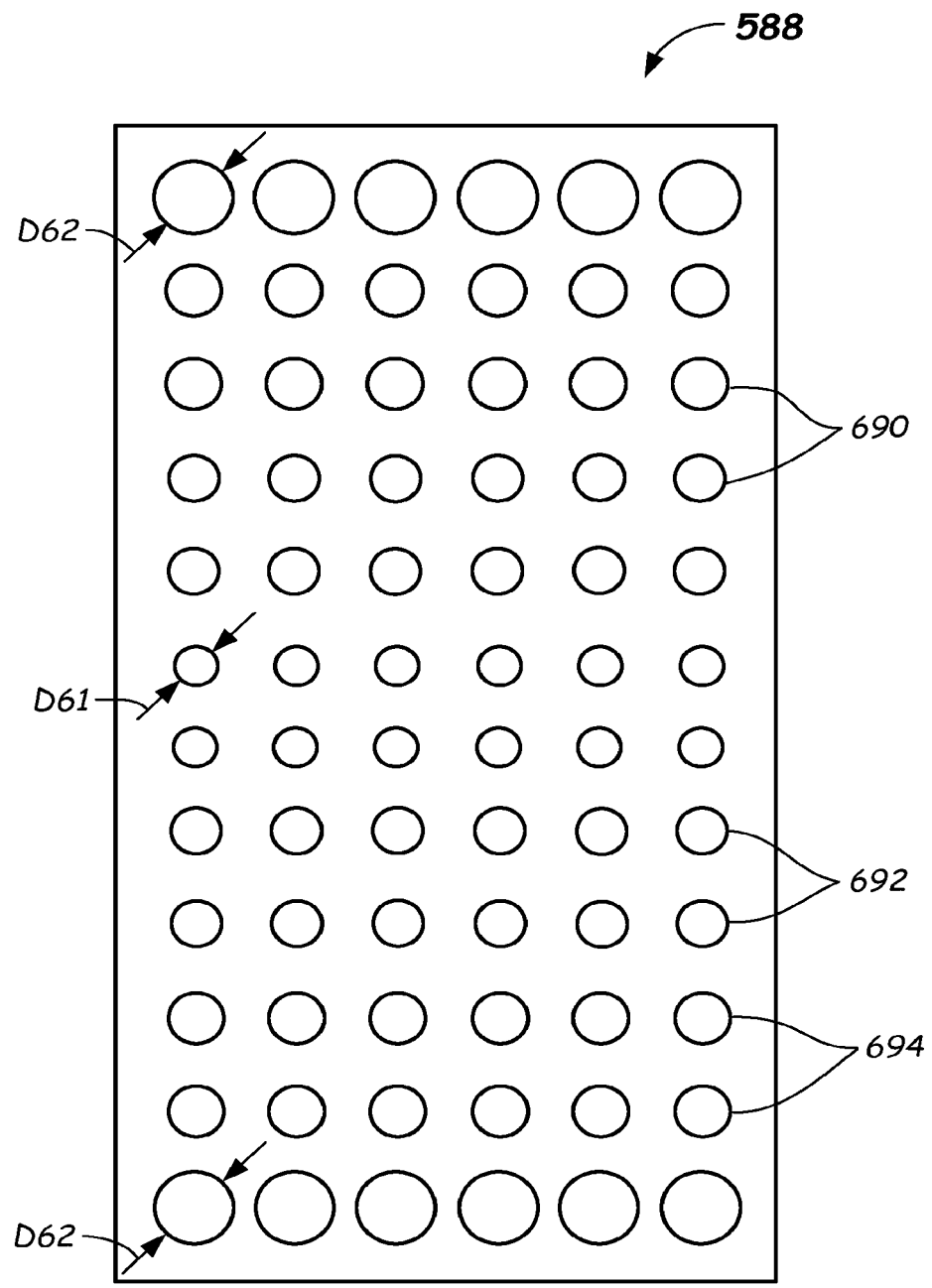
FIG. 6 illustrates a schematic diagram of an exhaust baffle according to one or more embodiments of the disclosure.

In some embodiments, an exhaust baffle 588 may be in the gas path between the substrates 435 and the exhaust plenum 128. In some embodiments, the exhaust baffle 588 may be located in the exhaust plenum 128. Reference is made to FIG. 6, which illustrates a front elevation view of an example embodiment of the exhaust baffle 588. Other exhaust baffle configurations may be used. The exhaust baffle 588 may include a plurality of holes 690 (a few labeled) that balance gas flow through the first side storage container 124, so that all the substrates on the substrate holders 582 (FIG. 5) are exposed to the same or approximately the same gas flow. In some embodiments, the holes 690 may have small diameters D61 at the center of the exhaust baffle 588 and large diameters D62 toward the top and bottom of the exhaust baffle 588. The holes 690 with the smaller diameters may be aligned with the exhaust port 448 (FIG. 5) to balance the gas flow. In some embodiments, the larger diameters D62 may be between about 15 mm and 17 mm in some embodiments and may be located toward the upper and lower ends of the exhaust baffle 588. The smaller diameter holes may range in size from about 7 to about 9 mm in some embodiments and may be aligned with the exhaust port 448. Other hole diameters and/or hole arrangements may be used.

In the embodiment of FIG. 6, the holes 690 may be arranged as a two-dimensional array wherein the diameters of the holes 690 progressively decrease from the top and bottom of the exhaust baffle 588 toward the middle of the exhaust baffle 588. In some embodiments, adjacent pairs of rows of holes 690 have the same diameters. For example, a first pair of rows 692 may have holes 690 having a first diameter and a second pair of rows 694 may have holes 690 having a second larger diameter.

Gas flow through the first side storage container chamber 562 enters the side storage container opening 560, passes over and/or around the substrates 435 (FIG. 4A) supported on the substrate holders 582, flows through the exhaust baffle 588, enters the exhaust plenum 128, and is exhausted via the exhaust port 448. The air flow configuration, including the exhaust port 448 being located at a midpoint between the top substrate holder 582A and the bottom substrate holder 582B enables an even gas flow over the substrates 435.

Figure 7:
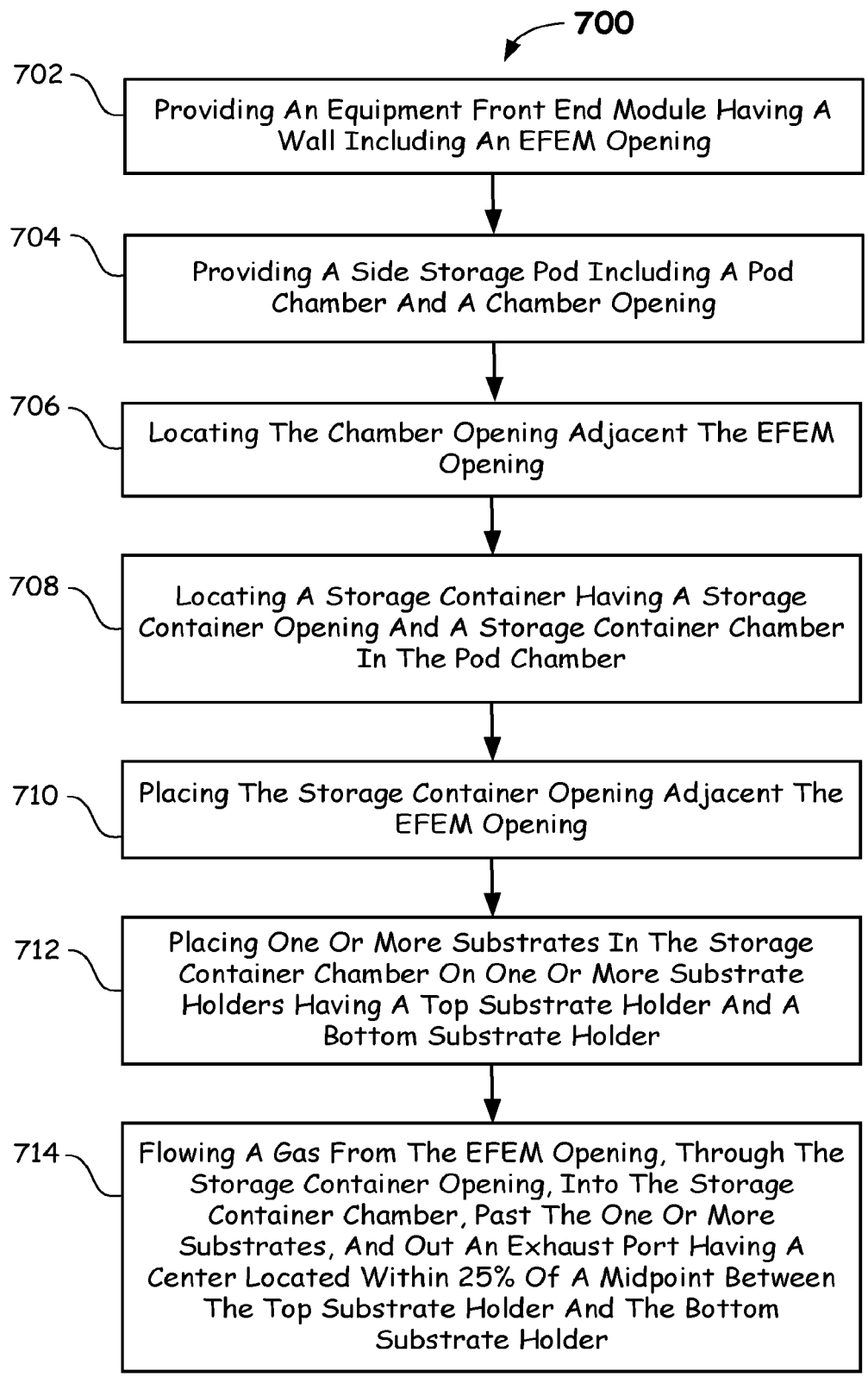
FIG. 7 illustrates a flowchart depicting a method of operating an electronic device manufacturing system according to one or more embodiments of the disclosure.

FIG. 7 illustrates a flowchart 700 describing a method of operating an electronic device processing system (e.g., electronic device processing system 100). The method includes, in 702, providing an equipment front end module (EFEM) (e.g., EFEM 114) having a wall (e.g., wall 420) including an EFEM opening (e.g., EFEM opening 566). The method includes, in 704, providing a side storage pod (e.g., side storage pod 122) including a pod chamber (e.g., first chamber 230) and a chamber opening (e.g., chamber opening 564). The method may include, in 706, locating the chamber opening adjacent the EFEM opening. The method may include, in 708, locating a storage container (e.g., first side storage container 124) having a storage container opening (e.g., side storage container opening 560) and a storage container chamber (e.g., first side storage container chamber 562) in the pod chamber. The method may include, in 710, placing the storage container opening adjacent the EFEM opening. The method may include, in 712, placing one or more substrates (e.g., substrates 435) in the storage container chamber on one or more substrate holders (e.g., substrate holders 582) having a top substrate holder (e.g., top substrate holder 582A) and a bottom substrate holder (e.g., bottom substrate holder 582B). The method may include, in 714, flowing a gas from the EFEM opening, through the storage container opening, into the storage container chamber, past the one or more substrates, and out an exhaust port (e.g., exhaust port 448) having a center (e.g., center C41) located within 25% of a midpoint between the top substrate holder and the bottom substrate holder.

The foregoing description discloses example embodiments of the disclosure. Modifications of the above-disclosed apparatus, systems, and methods which fall within the scope of the disclosure will be readily apparent to those of ordinary skill in the art. Accordingly, while the present disclosure has been disclosed in connection with example embodiments, it should be understood that other embodiments may fall within the scope of the disclosure, as defined by the claims.

What is claimed is:

1. A side storage pod, comprising:
a first chamber having a first chamber opening configured to be located adjacent a wall of a body of an equipment front end module; and
a first storage container received in the first chamber, comprising:
a first storage container opening located adjacent the first chamber opening;
a first storage container chamber fluidly coupled with the first storage container opening;
a plurality of substrate holders located in the first storage container chamber, the plurality of substrate holders extending between a top substrate holder and a bottom substrate holder;
a first exhaust plenum coupled to the first storage container chamber opposite the first storage container opening, wherein the plurality of substrate holders are located between the first storage container opening and the first exhaust plenum;
a first exhaust port having a center located on the first exhaust plenum within 25% of a midpoint between the top substrate holder and the bottom substrate holder, and
a first exhaust baffle disposed between the plurality of substrate holders and the first exhaust plenum, wherein the first exhaust baffle comprises a first plurality of holes each having a first diameter and a second plurality of holes each having a second diameter that is smaller than the first diameter, and wherein the second plurality of holes of the first exhaust baffle are aligned with the first exhaust port to balance a gas flow across substrates supported by the plurality of substrate holders.

2. The side storage pod of claim 1, wherein the center of the first exhaust port is located on the first exhaust plenum within 15% of a midpoint between the top substrate holder and the bottom substrate holder.

3. The side storage pod of claim 1, wherein the center of the first exhaust port is located on the first exhaust plenum within 5% of a midpoint between the top substrate holder and the bottom substrate holder.

4. The side storage pod of claim 1, wherein the first storage container chamber is sealed from the first chamber.

5. The side storage pod of claim 1, further comprising a first exhaust conduit coupled between the first exhaust port and a location external to the first chamber.

6. The side storage pod of claim 1, further comprising a door opening and a door having an open state and a closed state, wherein the first storage container is configured to pass through the door opening when the door is in the open state.

7. The side storage pod of claim 1, further comprising:
a second chamber having a second chamber opening configured to be located adjacent the wall of the body of the equipment front end module; and
a second storage container received in the second chamber.

8. The side storage pod of claim 7, wherein the second storage container comprises:
a second storage container opening located adjacent the second chamber opening;
a second storage container chamber fluidly coupled with the second storage container opening;
a plurality of vertically-spaced substrate holders located in the second storage container chamber, the plurality of substrate holders extending between a top substrate holder and a bottom substrate holder;
a second exhaust plenum coupled to the second storage container chamber opposite the second storage container opening, wherein the plurality of substrate holders are located between the second storage container opening and the second exhaust plenum; and
a second exhaust port having a center located on the second exhaust plenum within 25% of a midpoint between the top substrate holder and the bottom substrate holder.

9. The side storage pod of claim 7, wherein the first chamber and the second chamber are vertically aligned.

10. An electronic device processing system, comprising:
an equipment front end module (EFEM) body having a wall including an EFEM opening;

a side storage pod including a first chamber having a first chamber opening configured to be located adjacent the EFEM opening; and a first storage container received in the first chamber, comprising:
- a first storage container opening located adjacent the first chamber opening;
- a first storage container chamber fluidly coupled with the first storage container opening;
- a plurality of substrate holders located in the first storage container chamber, the plurality of substrate holders extending between a top substrate holder and a bottom substrate holder;
- an exhaust plenum coupled to the first storage container chamber opposite the first storage container opening, wherein the plurality of substrate holders are located between the first storage container opening and the exhaust plenum;
- an exhaust port having a center located on the exhaust plenum within 25% of a midpoint between the top substrate holder and the bottom substrate holder;
- an exhaust baffle disposed between the plurality of substrate holders and the exhaust plenum, wherein the exhaust baffle comprises a first plurality of holes each having a first diameter and a second plurality of holes each having a second diameter that is smaller than the first diameter, and wherein the second plurality of holes of the exhaust baffle are aligned with the exhaust port to balance a gas flow across substrates supported by each of the plurality of substrate holders.

11. The electronic device processing system of claim 10, wherein the EFEM comprises an equipment front end module chamber at least partially defined by the wall.

12. The electronic device processing system of claim 11, wherein the EFEM chamber is configured to be filled with an inert gas.

13. The electronic device processing system of claim 11, wherein the first storage container chamber and the EFEM chamber are fluidly coupled.

14. The electronic device processing system of claim 10, wherein the center of the exhaust port is located on the exhaust plenum within 15% of a midpoint between the top substrate holder and the bottom substrate holder.

15. The electronic device processing system of claim 10, wherein the center of the exhaust port is located on the exhaust plenum within 5% of a midpoint between the top substrate holder and the bottom substrate holder.

16. The electronic device processing system of claim 10, wherein the first storage container chamber is sealed from the first chamber.

17. The electronic device processing system of claim 10, further comprising an exhaust conduit coupled between the exhaust port and a location external to the first chamber.

18. The electronic device processing system of claim 10, further comprising a door opening and a door having an open state and a closed state, wherein the first storage container is configured to pass through the door opening when the door is in the open state.

19. The electronic device processing system of claim 10, further comprising:
- a second chamber having a second chamber opening configured to be located adjacent the wall of the EFEM; and
- a second storage container received in the second chamber.

20. A method of operating an electronic device processing system, comprising:
- providing an equipment front end module (EFEM) having a wall including an EFEM opening;
- providing a side storage pod including a pod chamber and a chamber opening;
- locating the chamber opening adjacent the EFEM opening;
- locating a storage container having a storage container opening and a storage container chamber in the pod chamber;
- placing the storage container opening adjacent the EFEM opening;
- placing one or more substrates in the storage container chamber on one or more substrate holders having a top substrate holder and a bottom substrate holder; and
- flowing a gas from the EFEM opening, through the storage container opening, into the storage container chamber, past the one or more substrates, through an exhaust baffle, and out an exhaust port having a center located within 25% of a midpoint between the top substrate holder and the bottom substrate holder, wherein the exhaust baffle comprises a first plurality of holes each having a first diameter and a second plurality of holes each having a second diameter that is smaller than the first diameter, and wherein the second plurality of holes of the exhaust baffle are aligned with the exhaust port to balance the flow of the gas past the one or more substrates placed on the one or more substrate holders.

* * * * *